United States Patent
Ogawa et al.

(10) Patent No.: US 9,859,111 B2
(45) Date of Patent: Jan. 2, 2018

(54) APPARATUS AND METHOD OF TREATING SURFACE OF SEMICONDUCTOR SUBSTRATE

(71) Applicant: TOSHIBA MEMORY CORPORATION, Tokyo (JP)

(72) Inventors: Yoshihiro Ogawa, Yokkaichi (JP); Tatsuhiko Koide, Yokkaichi (JP); Shinsuke Kimura, Yokkaichi (JP); Hisashi Okuchi, Yokohama (JP); Hiroshi Tomita, Yokohama (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 80 days.

(21) Appl. No.: 14/925,805

(22) Filed: Oct. 28, 2015

(65) Prior Publication Data
US 2016/0049289 A1 Feb. 18, 2016

Related U.S. Application Data

(62) Division of application No. 12/886,427, filed on Sep. 20, 2010, now abandoned.

(30) Foreign Application Priority Data

Dec. 11, 2009 (JP) ................................. 2009-281346

(51) Int. Cl.
*B44C 1/22* (2006.01)
*C03C 15/00* (2006.01)
(Continued)

(52) U.S. Cl.
CPC .... *H01L 21/0206* (2013.01); *H01L 21/02043* (2013.01); *H01L 21/02211* (2013.01);
(Continued)

(58) Field of Classification Search
USPC ........................................................ 216/41
See application file for complete search history.

(56) References Cited

U.S. PATENT DOCUMENTS

| 5,326,672 A | 7/1994 | Tanaka et al. |
| 5,374,502 A | 12/1994 | Tanaka et al. |

(Continued)

FOREIGN PATENT DOCUMENTS

| JP | 5-326464 | 12/1993 |
| JP | H06-105683 | 4/1994 |

(Continued)

OTHER PUBLICATIONS

Office Action issued by the Taiwanese Intellectual Property Office dated Jul. 24, 2014, in Taiwanese Patent Application No. 099130211, and English-language translation thereof.

(Continued)

*Primary Examiner* — Roberts Culbert
(74) *Attorney, Agent, or Firm* — Finnegan, Henderson, Farabow, Garrett & Dunner, L.L.P.

(57) ABSTRACT

In one embodiment, an apparatus of treating a surface of a semiconductor substrate comprises a substrate holding and rotating unit, first to fourth supplying units, and a removing unit. A substrate holding and rotating unit holds a semiconductor substrate, having a convex pattern formed on its surface, and rotates the semiconductor substrate. A first supplying unit supplies a chemical onto the surface of the semiconductor substrate in order to clean the semiconductor substrate. A second supplying unit supplies pure water to the surface of the semiconductor substrate in order to rinse the semiconductor substrate. A third supplying unit supplies a water repellent agent to the surface of the semiconductor substrate in order to form a water repellent protective film onto the surface of the convex pattern. A fourth supplying unit supplies alcohol, which is diluted with pure water, or (Continued)

acid water to the surface of the semiconductor substrate in order to rinse the semiconductor substrate. A removing unit removes the water repellent protective film with the convex pattern being left.

18 Claims, 9 Drawing Sheets

(51) Int. Cl.
*C03C 25/68* (2006.01)
*C23F 1/00* (2006.01)
*H01L 21/02* (2006.01)
*H01L 21/67* (2006.01)
*H01L 21/311* (2006.01)
*H01L 21/3213* (2006.01)

(52) U.S. Cl.
CPC .. *H01L 21/31116* (2013.01); *H01L 21/32135* (2013.01); *H01L 21/67028* (2013.01)

(56) References Cited

U.S. PATENT DOCUMENTS

| | | | |
|---|---|---|---|
| 6,620,260 | B2 | 9/2003 | Kumagai et al. |
| 6,698,439 | B2 | 3/2004 | Kamikawa et al. |
| 6,727,163 | B2 | 4/2004 | Kim et al. |
| 6,858,089 | B2 | 2/2005 | Castrucci |
| 7,163,018 | B2 | 1/2007 | Verhaverbeke et al. |
| 7,659,201 | B2 | 2/2010 | Ohashi et al. |
| 7,838,425 | B2 * | 11/2010 | Tomita .............. H01L 21/02057 134/2 |
| 8,361,234 | B2 | 1/2013 | Izuta et al. |
| 2002/0037371 | A1 | 3/2002 | Kumagai et al. |
| 2002/0189643 | A1 | 12/2002 | Chen et al. |
| 2004/0226582 | A1 | 11/2004 | Satoshi et al. |
| 2005/0205126 | A1 | 9/2005 | Okui et al. |
| 2006/0141641 | A1 | 6/2006 | Fan et al. |
| 2006/0278254 | A1 | 12/2006 | Jackson |
| 2007/0000524 | A1 | 1/2007 | Kimura |
| 2007/0102021 | A1 | 5/2007 | Nappa et al. |
| 2007/0295365 | A1 | 12/2007 | Miya et al. |
| 2008/0002162 | A1 | 1/2008 | Jansen et al. |
| 2008/0008973 | A1 | 1/2008 | Goto et al. |
| 2008/0020498 | A1 | 1/2008 | Okamoto et al. |
| 2008/0207005 | A1 | 8/2008 | Farkas |
| 2008/0295868 | A1 | 12/2008 | Nakamura et al. |
| 2009/0255558 | A1 | 10/2009 | Inukai et al. |
| 2009/0311874 | A1 | 12/2009 | Tomita et al. |
| 2011/0143541 | A1 | 6/2011 | Ogawa et al. |
| 2011/0143545 | A1 | 6/2011 | Okuchi et al. |

FOREIGN PATENT DOCUMENTS

| | | |
|---|---|---|
| JP | H06-302598 | 4/1994 |
| JP | 07-142349 | 6/1995 |
| JP | H07-273083 | 10/1995 |
| JP | H07-335603 | 12/1995 |
| JP | 2000-089477 | 3/2000 |
| JP | 2002-006476 | 1/2002 |
| JP | 2003-309101 | 10/2003 |
| JP | 2004-140321 | 5/2004 |
| JP | 2004-152946 | 5/2004 |
| JP | 2005-203563 | 7/2005 |
| JP | 3866130 | 10/2006 |
| JP | 2007-294544 | 11/2007 |
| JP | 2008-16780 | 1/2008 |
| JP | 2008-103769 | 5/2008 |
| JP | 2008-513552 | 5/2008 |
| JP | 2008-518460 | 5/2008 |
| JP | 2009-218456 | 9/2009 |
| JP | 2009-283956 | 12/2009 |
| JP | 2010-114440 | 5/2010 |
| KR | 10-2009-0130828 | 12/2009 |
| WO | WO2006049595 | 5/2006 |

OTHER PUBLICATIONS

Office Action issued by the Taiwanese Intellectual Property Office dated Feb. 25, 2014, in Taiwanese Patent Application No. 099130211, and English-language translation thereof.
Notification of Reason for Rejection issued by the Japanese Patent Office dated Mar. 19, 2013, for Japanese Patent Application No. 2009-281346, and English-language translation thereof.
Official Action issued by the Korean Patent Office dated Oct. 24, 2011, for Korean Patent Application No. 10-2010-88749, and a partial English-language translation thereof.
Machine Generated English Translation of JP 2009-218456 published Sep. 24, 2009.
Machine Generated English Translation of JP 2009-283956 published Dec. 3, 2009.
Machine Generated English Translation of KR 1020090130828 published Dec. 24, 2009.
Notification of Reasons for Rejection issued by the Japanese Patent Office dated Jul. 10, 2009, for Japanese Patent Application No. 2009-140992, and English-language translation thereof.
Notification of Reasons for Rejection issued by the Korean Intellectual Property Office dated Feb. 11, 2011, for Korean Patent Application No. 10-2009-52862, and English-language translation thereof.
Notification of Reasons for Rejection issued by the Japanese Patent Office dated Nov. 20, 2009, for Japanese Patent Application No. 2009-243777.

* cited by examiner

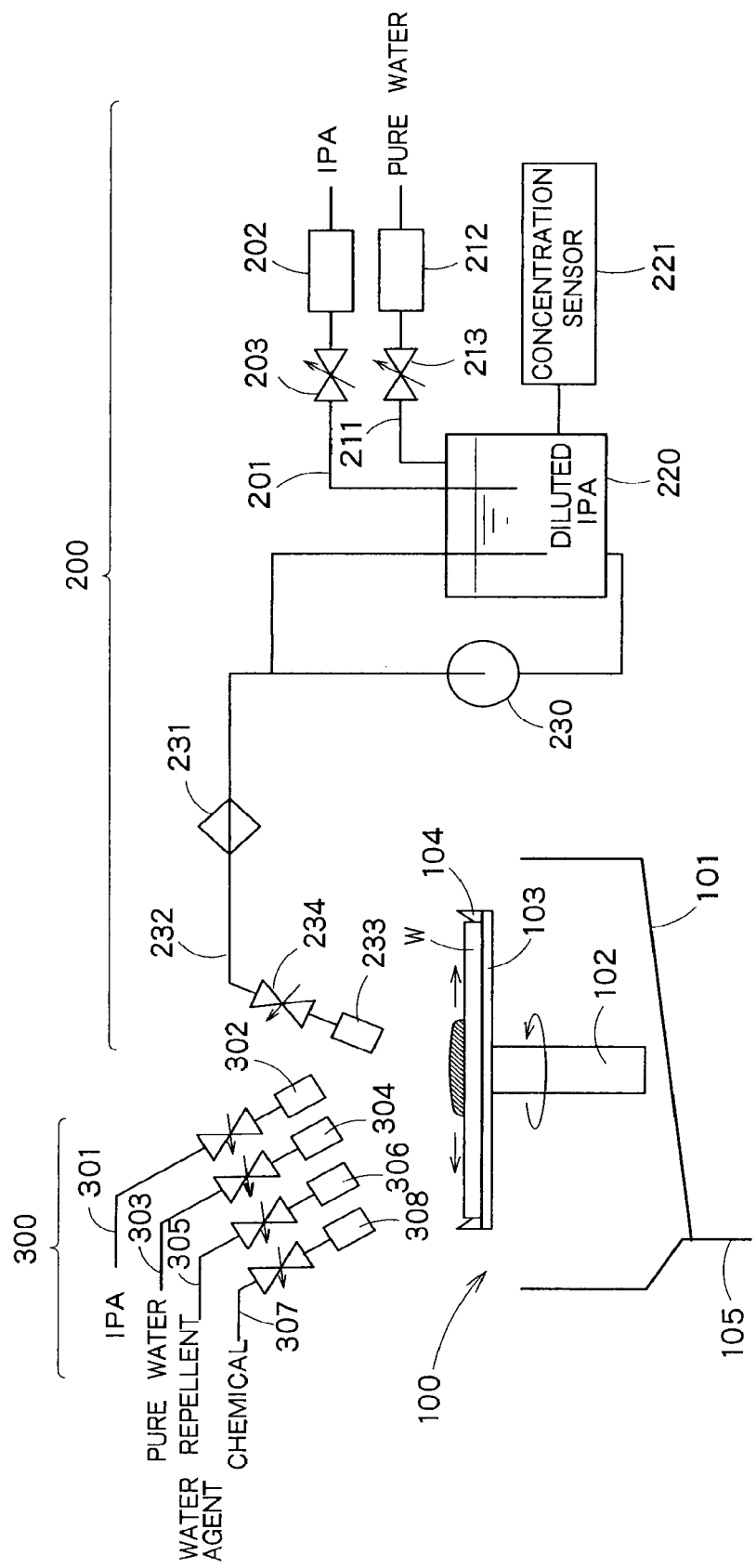
F I G. 1

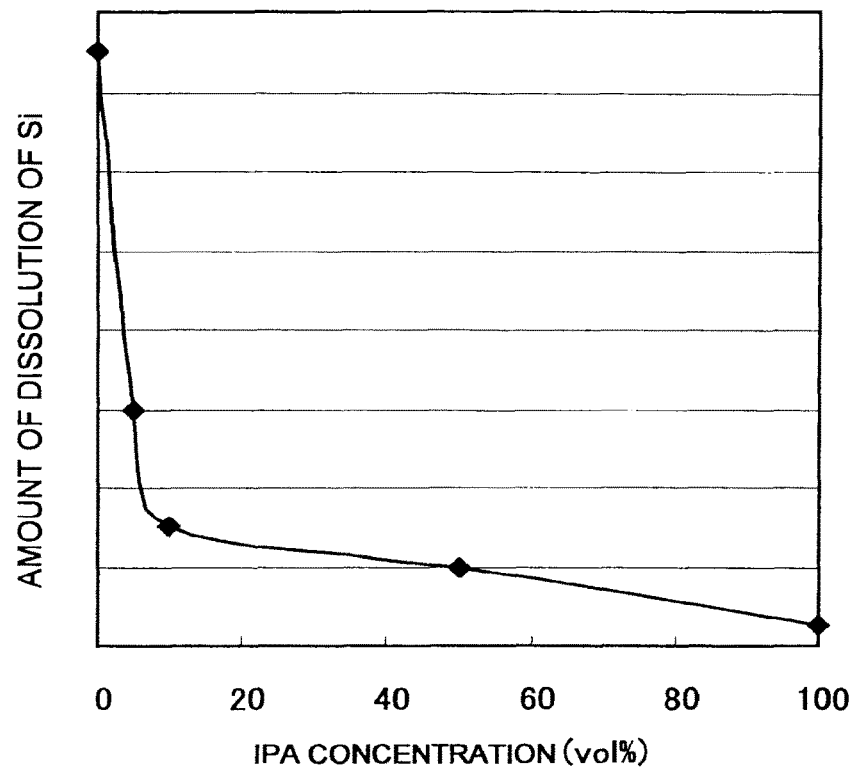
F I G. 5
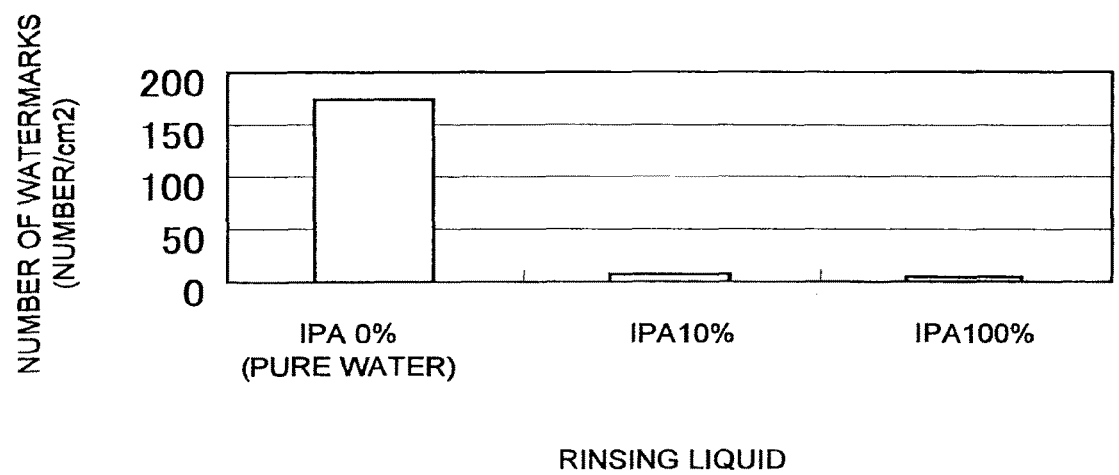
F I G. 6

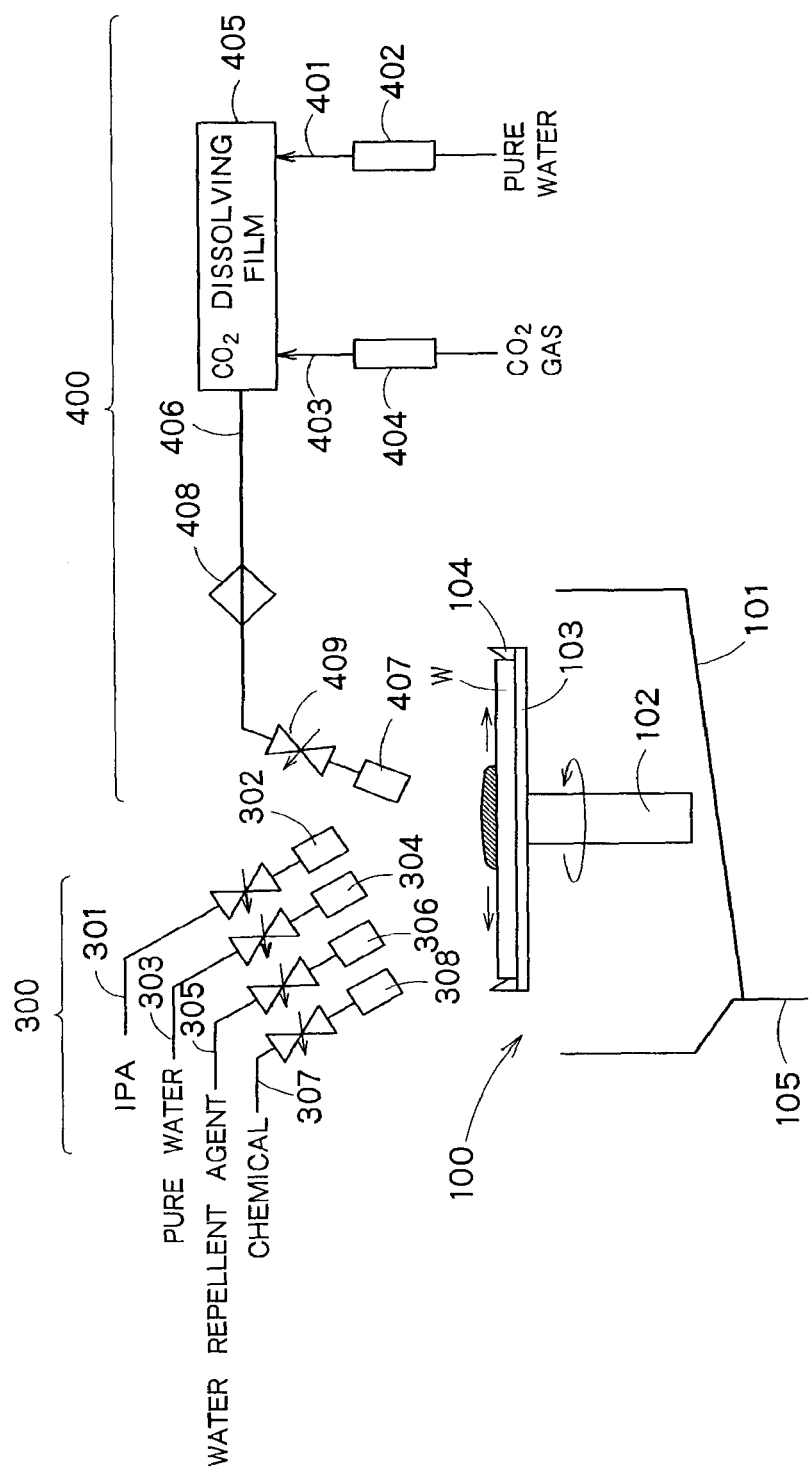
F I G. 9

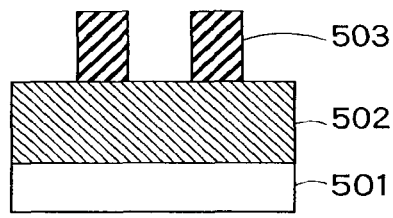
F I G. 10A
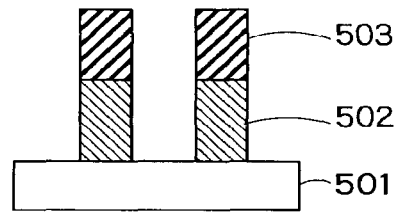
F I G. 10B
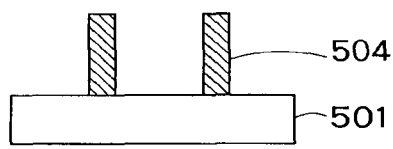
F I G. 10C
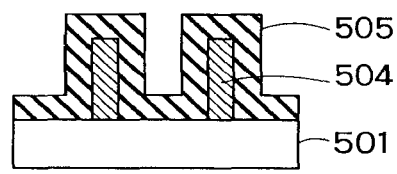
F I G. 10D
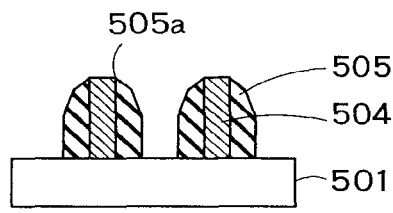
F I G. 11A
F I G. 11B
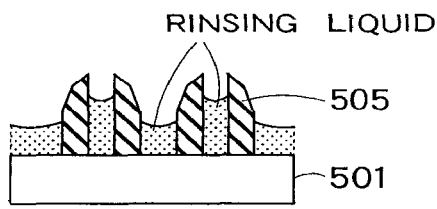
F I G. 11C

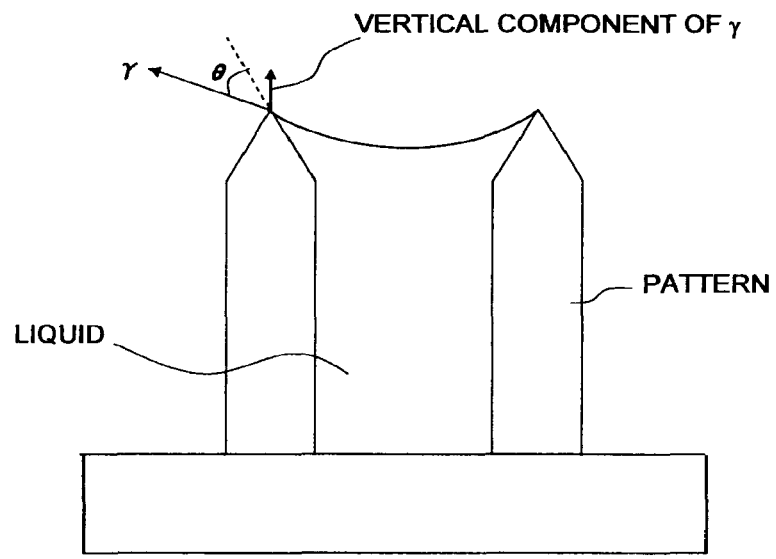
F I G. 12A
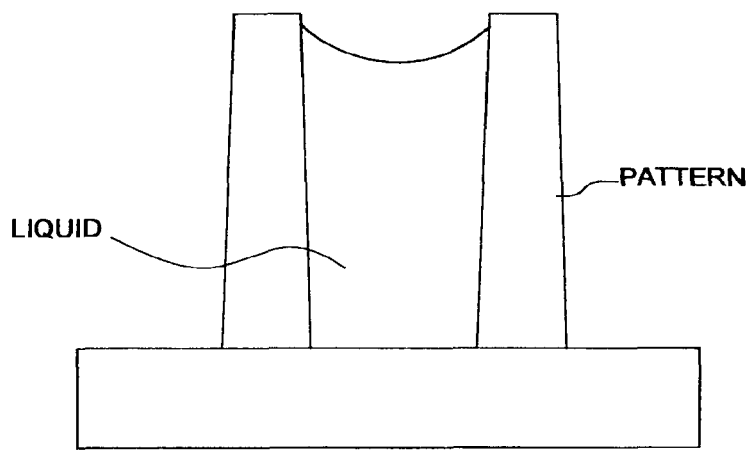
F I G. 12B

APPARATUS AND METHOD OF TREATING SURFACE OF SEMICONDUCTOR SUBSTRATE

CROSS REFERENCE TO RELATED APPLICATION

This application is a division of U.S. Application No. 12/886,427, filed Sep. 20, 2010, which claims benefit of priority from Japanese Patent Application No. 2009-281346, filed on Dec. 11, 2009. Each of these applications is incorporated herein by reference to its entirety.

FIELD

Embodiments described herein relate generally to an apparatus and a method of treating surface of a semiconductor substrate.

BACKGROUND

A manufacturing process of a semiconductor device includes various processes such as a lithography process, an etching process, and an ion implantation process. After each process is completed, and before the following process is started, a cleaning process and drying process for removing impurities and residues remaining on a surface of a wafer so as to clean the surface of the wafer are performed.

With microfabrication of a device, a problem of a resist pattern being collapsed due to a capillary action arises, when the resist pattern after the lithography process (exposure and development) is rinsed and dried. In order to solve this problem, there has been proposed a technique in which a surface of a resist pattern is made water repellant to reduce a capillary force acted between the resist pattern and a liquid developer as well as a rinsing pure water (e.g., JP-A 7-142349 (KOKAI)). According to this method, an organic substance is deposited on the surface of the resist pattern. However, this organic substance is removed in the etching process after the lithography process together with the resist pattern.

For example, in the wafer cleaning process after the lithography process, chemical used for the cleaning process of the surface of the wafer is supplied, and then, pure water is supplied to perform a rinsing process. After the rinsing process, the drying process is performed in which the pure water remaining on the surface of the wafer is removed to dry the same.

As the drying process, a spin drying is performed, for example, in which the wafer is rotated to remove the water content on the surface with centrifugal force. There arises a problem, during the drying process, that silicon is eluted to produce a drying stain called a watermark on the wafer, which reduces a yield. There arises a further problem that, during the drying process, the pattern on the wafer is collapsed due to the capillary force.

In recent years, there has been proposed a technique of drying a wafer by substituting the pure water on the wafer into IPA (isopropyl alcohol) with the use of IPA (e.g., specification of Japanese Patent No. 3866130). There has also been proposed a technique of using HFE (hydrofluoroether) having a surface tension lower than that of IPA. However, even by the drying methods described above, it is difficult to prevent the collapse of the micropattern on the wafer caused by the surface tension of liquid.

BRIEF DESCRIPTION OF THE DRAWINGS

FIG. 1 is a diagram showing a schematic configuration of a surface treatment apparatus of a semiconductor substrate according to a first embodiment of the present invention;

FIG. 5 is a graph showing a relationship between an IPA concentration and amount of dissolution of silicon;

FIG. 6 is a graph showing a relationship between an IPA concentration of rinsing liquid and a number of watermarks formed on a wafer;

FIG. 9 is a diagram showing a schematic configuration of a surface treatment apparatus of a semiconductor substrate according to a third embodiment of the present invention;

FIG. 10A is a sectional view showing a side-wall transfer process;

FIG. 10B is a cross-sectional view showing a step subsequent to FIG. 10A;

FIG. 10C is a cross-sectional view showing a step subsequent to FIG. 10B;

FIG. 10D is a cross-sectional view showing a step subsequent to FIG. 10C;

FIG. 11A is a cross-sectional view showing a step subsequent to FIG. 10D;

FIG. 11B is a cross-sectional view showing a step subsequent to FIG. 11A;

FIG. 11C is a cross-sectional view showing a step subsequent to FIG. 11B;

FIG. 12A is a view showing a surface tension of liquid to the pattern; and

FIG. 12B is a view showing a configuration in which the whole pattern is tilted.

DETAILED DESCRIPTION

Figure 2:
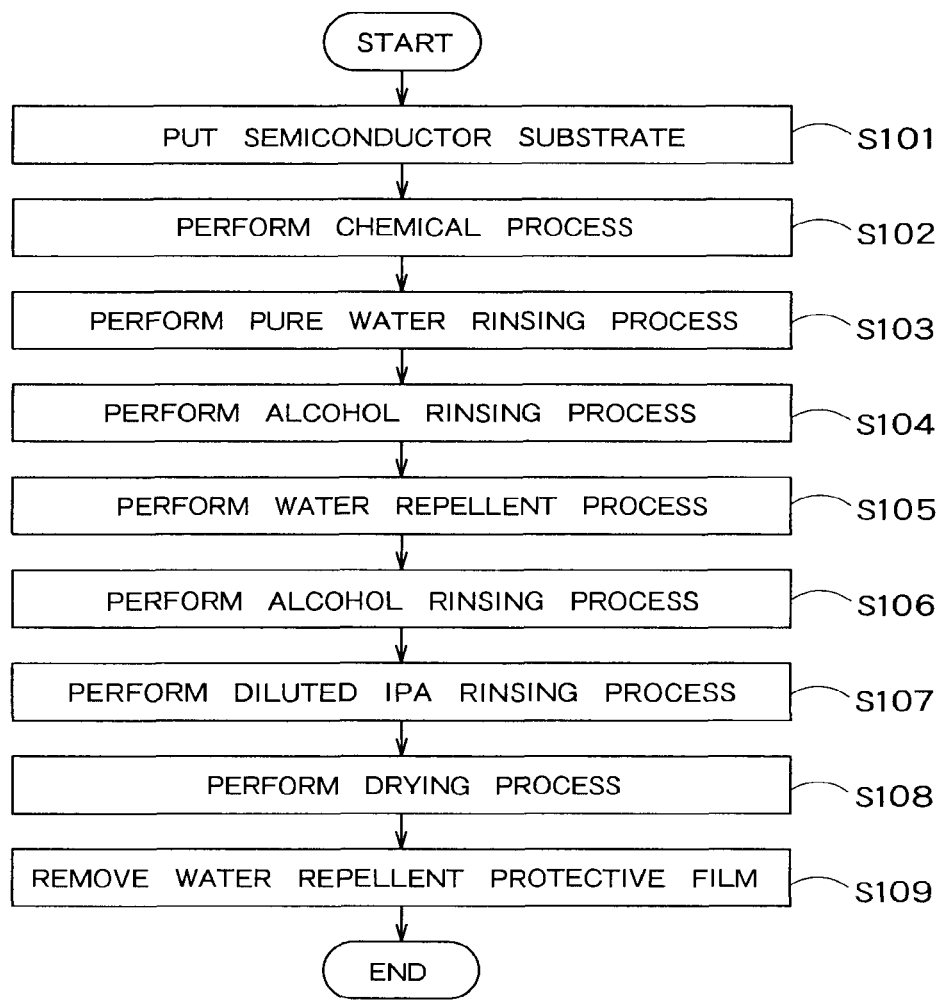
FIG. 2 is a flowchart explaining a surface treatment method of a semiconductor substrate according to the first embodiment.

In one embodiment, an apparatus of treating a surface of a semiconductor substrate comprises a substrate holding and rotating unit, a first supplying unit, a second supplying unit, a third supplying unit, a fourth supplying unit, and a removing unit. A substrate holding and rotating unit holds a semiconductor substrate, having a convex pattern formed on its surface, and rotates the semiconductor substrate. A first supplying unit supplies a chemical onto the surface of the semiconductor substrate, which is held by the substrate holding and rotating unit, in order to clean the semiconductor substrate. A second supplying unit supplies pure water to the surface of the semiconductor substrate, which is held by the substrate holding and rotating unit, in order to rinse the semiconductor substrate. A third supplying unit supplies a water repellent agent to the surface of the semiconductor substrate, which is held by the substrate holding and rotating unit, in order to form a water repellent protective film onto the surface of the convex pattern. A fourth supplying unit supplies alcohol, which is diluted with pure water, to the surface of the semiconductor substrate, which is held by the substrate holding and rotating unit, in order to rinse the semiconductor substrate. A removing unit removes the water repellent protective film with the convex pattern being left.

The cleaning process in the manufacturing process of a semiconductor device is to return a semiconductor substrate surface to a clean surface state without generating any defect (missing pattern, scratch, thinned pattern, dug substrate, or the like) in a fine pattern structure formed on a semiconductor substrate. Specifically, target matters to be cleaned includes resist material used in a lithography process, a reaction by-product (residue) remaining on a semiconductor wafer surface in a dry etching process, and metallic impurity, organic contaminant or the like, these processes are generally employed in a semiconductor manufacturing process. If the wafer is flown to the following manufacturing process while leaving the target materials to be cleaned, a device manufacturing yield ratio has to be lowered.

Accordingly, the cleaning process has an important role of forming a clean semiconductor wafer surface after cleaning without generating any defect (missing pattern, scratch, thinned pattern, dug substrate, or the like) in a fine pattern structure formed on the semiconductor substrate. As an element is miniaturized, cleanliness demanded in the cleaning process becomes higher.

On the other hand, in a recent structure in which a convex fine pattern of high aspect is provided (for example, a structure having pattern size of 30 nm or less, and an aspect ratio of 10 or more), since hydrophobic force is insufficient only by applying hydrophobic technique which is used in the resist process, it has been difficult to form a clean substrate surface with suppressing collapse of the pattern. On the other hand, in accordance with the following embodiment, it is possible to achieve high hydrophobic contact and to suppress the pattern collapse, while keeping the pattern surface clean, with respect to the structure having the convex fine pattern of high aspect.

(First Embodiment)

FIG. 1 shows a schematic configuration of a surface treatment apparatus of a semiconductor substrate according to a first embodiment of the present invention. The surface treatment apparatus includes a substrate holding and rotating unit 100, a diluted IPA supplying unit 200, and a chemical supplying unit 300.

The substrate holding and rotating unit 100 has a spin cup 101 constituting a process chamber, a rotation axis 102, a spin base 103, and a chuck pin 104. The rotation axis 102 extends substantially in a vertical direction, and the disk-like spin base 103 is mounted on the upper end of the rotation axis 102. The rotation axis 102 and the spin base 103 are rotated with a motor (not shown).

The chuck pin 104 is mounted on the peripheral end of the spin base 103. The chuck pin 104 holds the substrate (wafer) W, whereby the substrate holding and rotating unit 100 can hold and rotate the substrate W in substantially horizontal direction.

When liquid is supplied to the vicinity of the rotation center of the surface of the substrate W from the diluted IPA supplying unit 200 or the chemical supplying unit 300, the liquid spreads in the radius direction of the substrate W. The substrate holding and rotating unit 100 can perform a spin-drying of the substrate W. The unnecessary liquid scattering in the radius direction of the substrate W is caught by the spin cup 101, and discharged through a waste liquid tube 105.

The diluted IPA supplying unit 200 supplies diluted IPA (isopropyl alcohol) to the substrate W that is held by the substrate holding and rotating unit 100. The diluted IPA is supplied to the semiconductor substrate W before the spin-drying.

The IPA is stored in a buffer tank 220 through a supplying line (tube) 201. The supplying line 201 is provided with a flowmeter 202 and a valve 203 so as to be capable of controlling the supplied amount to the buffer tank 220.

Pure water is supplied to the buffer tank 220 through a supplying line 211. The supplying line 211 is provided with a flowmeter 212 and a valve 213 so as to be capable of controlling the supplied amount to the buffer tank 220.

The buffer tank 220 stores the IPA and pure water, i.e., the diluted IPA (diluted IPA). A concentration sensor 221 for detecting the IPA concentration of the diluted IPA is provided to the buffer tank 220. The open degrees of the valves 203 and 213 are controlled based on the detection result of the concentration sensor 221, whereby the diluted IPA in the buffer tank 220 can be adjusted to have a desired concentration.

The diluted IPA in the buffer tank 220 is discharged by a pump 230, passes through a filter 231, and then, ejected from a nozzle 233 through a supplying line 232 to be supplied to the surface of the substrate W. A valve 234 is provided to the supplying line 232, so that the supplied amount and flow rate of the diluted IPA to the surface of the substrate W can be controlled. Some of the diluted IPA discharged from the pump 230 is returned again to the buffer tank 220 for circulation.

The chemical supplying unit 300 can supply the IPA, pure water, and water repellent agent to the surface of the substrate W. The IPA is supplied through a supplying line 301, and ejected from a nozzle 302. Similarly, the pure water is supplied through a supplying line 303 and ejected from a nozzle 304. The water repellent agent is supplied through a supplying line 305, and ejected from a nozzle 306. The chemical supplying unit 300 has a line 307 for supplying other chemicals such as SPM (Sulfuric acid Hydrogen Peroxide Mixture) and a nozzle 308 for ejecting the same.

The water repellent agent is a chemical that forms a water repellent protective film on the surface of a pattern, having a convex shape and formed on the surface of the substrate W, so as to make the surface of the pattern water repellent. The water repellent agent is, for example, a silane coupling agent. The silane coupling agent has a hydrolysable group having affinity and reactivity for an inorganic material, and an organic functional group that is chemically bonded to an organic material, in a molecule. Examples of usable silane coupling agent include hexamethyldisilazane (HMDS), tetramethyl silyl diethylamine (TMSDEA), or the like. To make the surface of the pattern having the convex shape water repellent will be described below.

The surface treatment apparatus also has an excimer UV (ultraviolet) irradiating unit (not shown). The excimer UV irradiating unit irradiates an ultraviolet ray to the semiconductor substrate W to be capable of allowing the convex pattern to be left and of removing the water repellent protective film. A removing unit for removing the water repellent protective film but allowing the convex pattern to be left with the method other than the ultraviolet irradiation may be provided.

A method for performing a surface treatment of a semiconductor substrate by using the surface treatment apparatus described above will be described with reference to the flowchart shown in FIG. 2. The operations of the substrate holding and rotating unit 100, the diluted IPA supplying unit 200, and the chemical supplying unit 300 can be controlled by a control unit not shown.

(Step S101) The semiconductor substrate W, which has plural convex patterns on a predetermined area of a surface and which is a subject to be processed, is carried in by a conveying unit (not shown), and held by the substrate holding and rotating unit 100. The convex pattern is, for example, a line and space pattern. A part of the convex pattern may be formed of a film containing silicon. The convex pattern is formed by, for example, an RIE (Reactive Ion Etching) method.

(Step S102) The semiconductor substrate W is rotated with a predetermined revolution, and the chemical supplying unit 300 supplies the chemical to the vicinity of the rotation center of the surface of the semiconductor substrate W. The chemical is, for example, SPM, SC-1 (Standard Clean 1), SC-2, or HF. One type of chemical may be used, or plural chemicals may simultaneously or continuously be supplied.

The chemical receives centrifugal force from the rotation of the semiconductor substrate W to be spread all over the surface of the semiconductor substrate W, whereby the chemical (cleaning) process is performed to the semiconductor substrate W.

(Step S103) The chemical supplying unit 300 supplies pure water to the vicinity of the rotation center of the surface of the semiconductor substrate W. The pure water receives centrifugal force by the rotation of the semiconductor substrate W to be spread all over the surface of the semiconductor substrate W. Thus, a pure water rinsing process is performed in which the chemical remaining on the surface of the semiconductor substrate W is washed away by the pure water.

(Step S104) The chemical supplying unit 300 supplies alcohol, such as IPA, to the vicinity of the rotation center of the surface of the semiconductor substrate W. The IPA receives centrifugal force by the rotation of the semiconductor substrate W to be spread all over the surface of the semiconductor substrate W. Thus, an alcohol rinsing process is performed in which the pure water remaining onto the surface of the semiconductor substrate W is substituted with the IPA.

(Step S105) The chemical supplying unit 300 supplies a water repellent agent to the vicinity of the rotation center of the surface of the semiconductor substrate W. The water repellent agent is, for example, a silane coupling agent.

The silane coupling agent receives centrifugal force by the rotation of the semiconductor substrate W to be spread all over the surface of the semiconductor substrate W. Thus, a protective film (water repellent protective film) having low wettability is formed on the surface of the convex pattern.

The water repellent protective film is formed because of an ester reaction of the silane coupling agent. Accordingly, an annealing process may be performed to raise the liquid temperature in order to accelerate the reaction.

When the convex pattern is a silicon nitride film or a silicon film such as polysilicon, a silylation reaction may be insufficient even if a silylation process is performed using the silane coupling agent, so that water repellency sufficient for preventing the collapse of the pattern cannot be obtained. In this case, it is preferable that, in step S102, a process by a process chemical containing an oxide agent that can oxidize the surface of the silicon material is added so as to change the surface of the silicon material into a chemical oxide film of the silicon oxide. Thereafter, the silylation process is performed, whereby the water repellency after the silylation process can be enhanced.

Figure 3A:
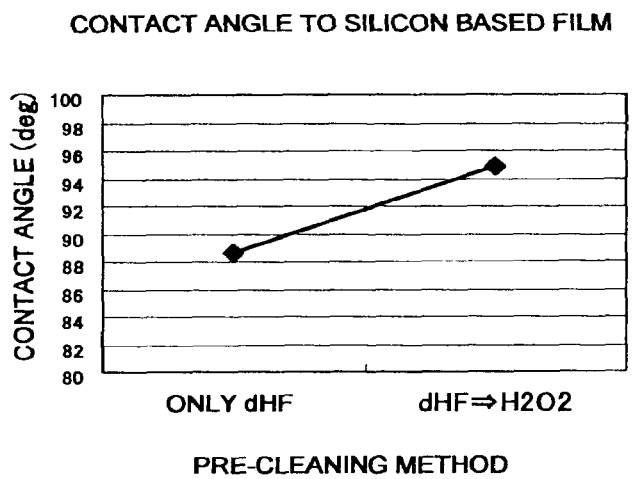
FIG. 3A is a graph showing a relationship between a cleaning sequence and a contact angle of water to a pattern.

When the convex pattern is the silicon based film, for example, only a dHF process is performed to form the water repellent protective film. As a result, the contact angle of water to the pattern is 89° as shown in FIG. 3A. When $H_2O_2$ process is added to this process, the contact angle increases up to 95°. This is considered because an appropriate oxide film is formed on the surface of the silicon based film.

Figure 3B:
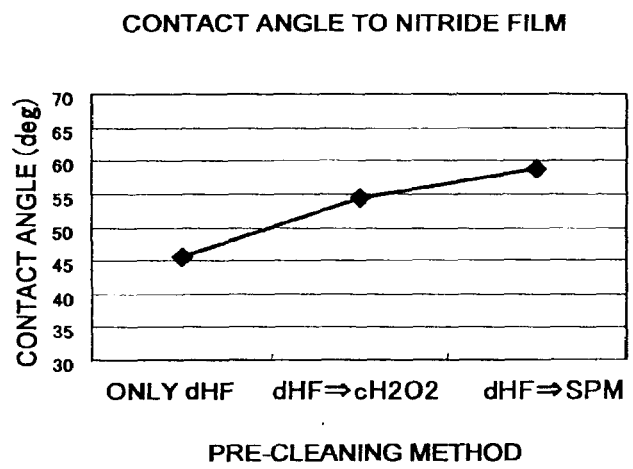
FIG. 3B is a graph showing a relationship between a cleaning sequence and a contact angle of water to a pattern.

As showing in FIG. 3B, when the convex pattern is the silicon nitride film and the water repellent protective film is formed only by using the dHF process, the contact angle of water is about 46°. When the $H_2O_2$ process is added to this process, the contact angle increases up to 54°, and when an SPM process is added, the contact angle increases up to 59°. This is considered because the water repellent protective film is easy to be formed since an optimum modifying process is added in order to allow the water-repellent process to be performed on the surface of the substrate after the cleaning.

After an RIE (Reactive Ion Etching) process, many process residues are produced after the process. The water repellent protective film is difficult to be formed with the process residues being left. Therefore, removing the residues through the SPM process in step S102 is effective for forming the water repellent protective film. Further, a plasma damage is accumulated onto the pattern surface with the RIE process to thereby form a dangling-bond. When the modifying process is performed with the chemical having an oxidation effect, the dangling-bond is modified with an OH group. When many OH groups are present, the probability of the silylation reaction is increased, so that the water repellent protective film is easy to be formed. Therefore, more higher water repellency can be achieved. In this case, an effect can be provided even if the micropattern is a silicon oxide film.

In the above description, the surface of the semiconductor substrate W is modified with the process chemical different from the cleaning chemical after the semiconductor substrate W is cleaned. However, the modifying process does not have to be performed separately, if the cleaning chemical is also used to achieve the modifying effect, i.e., the cleaning chemical has an oxidation effect. However, when the cleaning process and the modifying process are separately performed, the modification is performed to the cleaned surface after the surface, which is to be cleaned, of the convex micropattern is cleaned. Therefore, the modifying effect can further be enhanced, compared to the case of using the chemical having the oxidation effect. Accordingly, it is desirable to separate the cleaning process and the modifying process.

(Step S106) The chemical supplying unit 300 supplies the IPA to the vicinity of the rotation center of the surface of the semiconductor substrate W. The IPA receives centrifugal force by the rotation of the semiconductor substrate W to be spread all over the surface of the semiconductor substrate W. Thus, the alcohol rinsing process is performed in which the unreacted silane coupling agent remaining onto the surface of the semiconductor substrate W is substituted with the IPA. The IPA supplied here is the one that is not diluted and has a concentration of 100%.

(Step S107) The diluted IPA supplying unit 200 supplies the diluted IPA to the vicinity of the rotation center of the surface of the semiconductor substrate W. The diluted IPA receives centrifugal force by the rotation of the semiconductor substrate W to be spread all over the surface of the semiconductor substrate W. Thus, the diluted IPA rinsing process is performed in which the IPA remaining on the surface of the semiconductor substrate W is washed away with the diluted IPA.

(Step S108) The semiconductor substrate W is subject to the drying process. For example, the spin-drying process is performed in which the revolution speed of the semiconductor substrate W increases to a predetermined spin-drying speed so as to blow away the diluted IPA remaining onto the surface of the semiconductor substrate W.

Since the convex pattern formed on the semiconductor substrate W is covered with the water repellent protective film, the contact angle θ of the liquid increases. In particular, the contact angle θ is made close to 90° by substituting the liquid onto the surface of the semiconductor substrate W with the diluted IPA in step S107.

Figure 4:
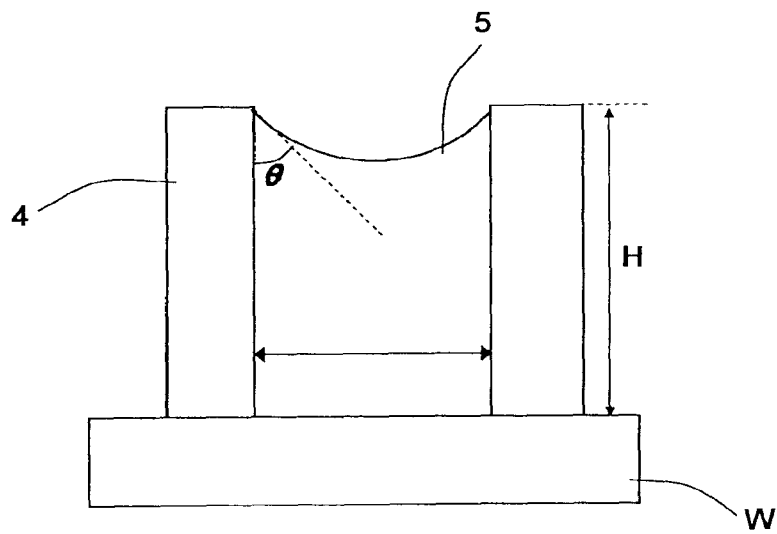
FIG. 4 is a view showing surface tension of liquid to the pattern.

FIG. 4 shows the state in which a part of the pattern 4 formed on the semiconductor substrate W is wet with the liquid 5. When the distance between the pattern 4 is defined as Space, the height of the pattern 4 is H, and the surface tension of the liquid 5 is defined as γ, the force P applied to the pattern 4 is as follows: P =2×γ×cosθ H/Space (Equation 1).

Since θ is made close to 90°, cosθ approaches zero, which indicates that the force P applied to the pattern during the drying process is decreased. Thus, the collapse of the pattern during the drying process can be prevented.

The watermark will next be considered. The watermark is formed by the elution of silicon during the drying process. FIG. 5 shows the relationship between the IPA concentration of the rinsing liquid, which is obtained by mixing pure water and IPA, and the amount of dissolution of the silicon in the rinsing liquid. The axis of ordinate in FIG. 5 represents the result of chemical analysis of the amount of dissolution of silicon in the rinsing liquid, while the axis of abscissa represents the IPA concentration of the rinsing liquid. It is understood from FIG. 5 that, when the IPA concentration is 0%, i.e., in the case of the pure water, the amount of dissolution of silicon is great, and with the increase of the IPA concentration, the amount of dissolution of silicon is reduced.

FIG. 6 shows the relationship between the IPA concentration of the rising liquid used in step S107 and the number of watermarks formed on the wafer after the drying process. The number of the watermarks is obtained from an optical defect inspection and an SEM image analysis on the surface of the wafer. It is understood from FIG. 6 that the number of the watermarks is reduced by using the rinsing liquid containing the IPA, compared with the case of the rising process with the use of the pure water.

In the present embodiment, the diluted IPA rinsing process is performed in the rinsing process (step S107) before the drying process, so that the elution of silicon is prevented to prevent the formation of the watermarks.

(Step S109) Ultraviolet ray is irradiated from the excimer UV irradiating unit to remove the water repellent protective film formed on the surface of the convex pattern. The present embodiment is to clean and dry the surface of the semiconductor substrate. Therefore, the cleaning process is completed by removing the water repellent protective film. When the water repellent protective film is to be removed in the process next to this process, the water repellent protective film does not have to be removed soon after the drying process.

FIG. 7 shows the patterns after the drying process in case where the water repellent protective film is formed and in case where the water repellent protective film is not formed. Three types of patterns, each having a height of line of 150 nm, 170 nm, and 200 nm, respectively, and three types of patterns, each having a line width of normal, fine, and ultra-fine (normal>fine>ultra-fine), are subject to the surface treatment.

Figure 7B:
FIG. 7B is a view showing a state of a pattern after a drying process in case where a water repellent protective film is formed.
Figure 7A:
FIG. 7A is a view showing a state of a pattern after a drying process in case where a water repellent protective film is not formed.

As understood from FIG. 7A, in the case of patterns having ultra-fine line width having the water repellent protective film not formed thereon, the patterns having the line height of 150 nm, 170 nm, and 200 nm were all collapsed. Further, the pattern, having the fine line width, having the line height of 200 nm, and having the water repellent protective film not formed thereon, was collapsed.

On the other hand, as understood from FIG. 7B, when the water repellent protective film was formed, the collapse of the pattern could be prevented except for the pattern having the ultra-fine line width and having the line height of 200 nm. It is understood from the above that, when the water repellent protective film is formed, even the collapse of the pattern having a high aspect ratio due to the cleaning and drying processes can be prevented, whereby the collapse margin can be enhanced.

As described above, in the present embodiment, the water repellent protective film is formed upon cleaning the surface of the semiconductor substrate W, whereby the collapse of the micropattern having the convex shape can be prevented during the drying process. Since the diluted IPA rinsing process is performed before the drying process, the elution of silicon is prevented to prevent the formation of the watermark.

In order to prevent the collapse of the pattern formed on the substrate, the force applied to the pattern (P represented by the equation 1) should be reduced. Among the parameters in the equation 1, the Space is a fixed parameter determined by the pattern size, and the wettability cosθ is a fixed parameter determined by the relationship between the material constituting the micropattern (the surface of the micropattern) and the liquid. Therefore, in the conventional substrate process, attention is focused on the surface tension γ, and the liquid having small γ is used in order to reduce the force applied to the pattern. However, there is a limitation on reducing γ, and hence, it becomes impossible to prevent the collapse of the pattern.

On the other hand, in the surface treatment method according to the present embodiment, the water repellent protective film is formed on the surface of the pattern so as to control the wettability cosθ, whereby the force applied to the pattern during the drying process is greatly reduced, which can prevent the collapse of the pattern.

The surface treatment method according to the present embodiment is particularly effective for preventing the collapse of the pattern having an aspect ratio of eight or more.

In the present embodiment, the alcohol rinsing process is performed (steps S104 and S106) before and after the process of forming the water repellent protective film (step S105). This is because the silane coupling agent used for forming the water repellent protective film may not be capable of being substituted with pure water, depending on the type thereof. Therefore, the alcohol rinsing process can be omitted, when the silane coupling agent to be used can be substituted with the pure water.

In the present embodiment, the water repellent agent may be diluted within a range that can form the water repellent protective film. When the water repellent agent is diluted with cheap chemical such as cyclohexanone or alcohol, cost can be reduced. When the silane coupling agent used as the water repellent agent might hydrolyze by a hydroxyl group in the IPA to reduce the water-repellent capability, the IPA on the semiconductor substrate may be substituted with thinner before the water repellent agent is supplied.

In the above-mentioned present embodiment, the buffer tank 220 may be provided at the outside of the main body of the surface treatment apparatus. Instead of the concentration sensor 221, a weighing pump and a fluid level sensor for detecting a fluid level position in the buffer tank 220 may be provided so as to adjust the dilution degree of the IPA.

In the present embodiment, the IPA and pure water are mixed in the buffer tank 220. However, a mixing valve coupled to the supplying lines 201 and 211 may be provided immediately before the nozzle 233 so as to supply the diluted IPA to the substrate W. Further, the IPA and pure water may be directly supplied to the substrate W to be mixed on the substrate W. In this case, the diluted IPA supplying unit 200 may be eliminated.

(Second Embodiment)

Figure 8:
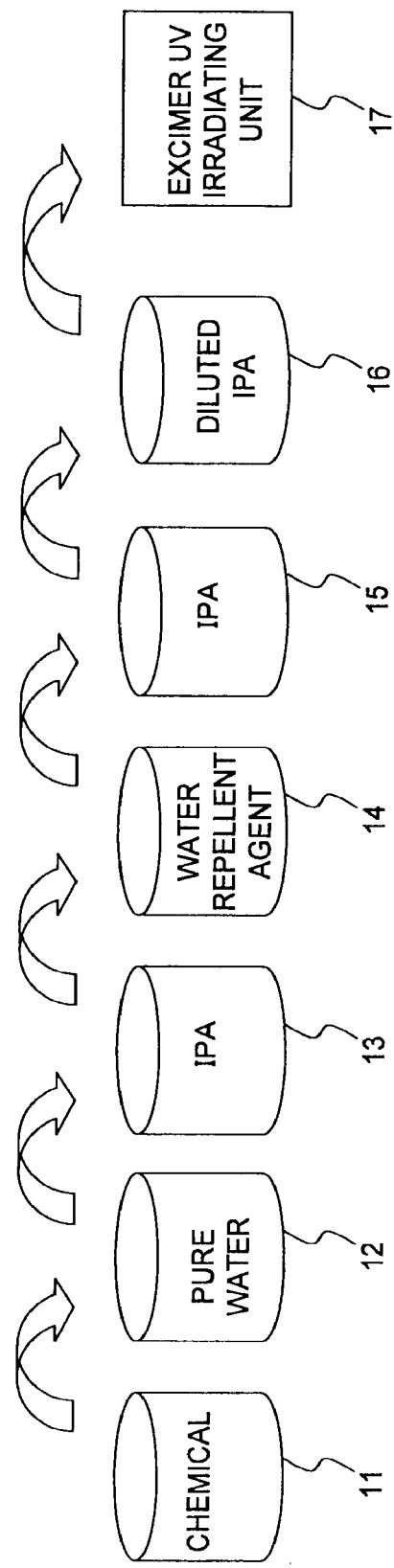
FIG. 8 is a diagram showing a schematic configuration of a surface treatment apparatus of a semiconductor substrate according to a second embodiment of the present invention.

FIG. 8 shows a schematic configuration of a surface treatment apparatus of a semiconductor substrate according to a second embodiment of the present invention. The surface treatment apparatus according to the present embodiment is a batch-type surface treatment apparatus that performs a cleaning and drying to plural semiconductor substrates at a time.

The surface treatment apparatus includes tanks 11 to 16, excimer UV irradiating unit 17, gas supplying unit, and a conveying unit (both are not shown). The conveying unit can hold and convey plural substrates.

The tank 11 stores chemicals for cleaning the substrate, such as SPM, SC-1 (Standard Clean 1), SC-2, and HF. Since the conveying unit carries the substrate into the tank 11, the chemical process (step S102) in the surface treatment method according to the first embodiment can be performed.

The tank 12 stores pure water. Since the conveying unit pulls up the substrate from the tank 11 and puts the same into the tank 12, the pure water rinsing process (step S103) of the surface treatment method according to the first embodiment can be performed.

The tank 13 stores the IPA. Since the conveying unit pulls up the substrate from the tank 12 and puts the same into the tank 13, the alcohol rinsing process (step S104) of the surface treatment method according to the first embodiment can be performed.

The tank 14 stores the water repellent agent. Since the conveying unit pulls up the substrate from the tank 13 and puts the same into the tank 14, the water repellent protective film is formed on the convex pattern on the substrate, whereby the water repellent process (step S105) of the surface treatment method according to the first embodiment can be performed. The diluted solvent may be supplied to the tank 14 to dilute the water repellent agent.

The tank 15 stores the IPA. Since the conveying unit pulls up the substrate from the tank 14 and puts the same into the tank 15, the alcohol rinsing process (step S106) of the surface treatment method according to the first embodiment can be performed.

The tank 16 stores the diluted IPA that is obtained by mixing the IPA and water. Since the conveying unit pulls up the substrate from the tank 15 and puts the same into the tank 16, the diluted IPA rinsing process (step S107) of the surface treatment method according to the first embodiment can be performed.

The gas supplying unit supplies dry air to the substrate in order to be capable of performing the evaporative drying to the substrate. The conveying unit pulls up the substrate from the tank 16, and then, the gas supplying unit supplies dry air to the substrate for drying. Thus, the drying process (step S108) in the surface treatment method according to the first embodiment can be performed. The drying process is not limited to the above-mentioned process. The other method such as a spin drying may be employed.

Since the substrate is put into the tank 14 to form the water repellent protective film onto the surface of the convex pattern, the force applied to the pattern is small, whereby the collapse of the pattern can be prevented. Since the substrate is put into the tank 16 to perform the diluted IPA process, the elution of silicon can be prevented to prevent the formation of the watermark.

The conveying unit conveys the dried substrate to the excimer UV irradiating unit 17. The excimer UV irradiating unit 17 irradiates ultraviolet ray to remove the water repellent protective film formed on the surface of the convex pattern. Thus, the water repellent protective film removing process (step S109) in the surface treatment method according to the first embodiment can be performed.

As described above, the collapse of the pattern and the formation of the watermark can be prevented, and the substrate can be cleaned and dried, like the first embodiment, by using the batch-type surface treatment apparatus according to the present embodiment.

The surface treatment apparatus according to the second embodiment has tanks 11 to 16 according to the type of the liquid. However, the apparatus may be configured to have an over-flow structure in which a single tank is provided, and the liquid is supplied through a continuous changeover.

(Third Embodiment)

In the above-mentioned first embodiment, the rinsing process is performed by using the diluted IPA before the drying process. However, acid water such as carbonated water may be used. FIG. 9 shows an example of a configuration of a surface treatment apparatus of a semiconductor substrate for performing the process described above.

The surface treatment apparatus is different from the surface treatment apparatus in the first embodiment shown in FIG. 1 in that the diluted IPA supplying unit 200 is not provided and an acid water supplying unit 400 is provided. The components in FIG. 9 same as those in the first embodiment in FIG. 1 are identified by the same numerals, and the description will not be repeated.

The acid water supplying unit 400 includes a supplying line 401 that supplies pure water, a flowmeter 402 provided on the supplying line 401, a supplying line 403 that supplies carbon dioxide gas, a flowmeter 404 provided on the supplying line 403, a carbon dioxide dissolving film 405, a supplying line 406 that flows carbonated water, a nozzle 407 that ejects the carbonated water, and a filter 408 and a valve 409 that are provided on the supplying line 406.

Pure water is supplied to the carbon dioxide dissolving film 405 through the supplying line 401, and carbon dioxide gas is supplied to the carbon dioxide dissolving film 405 through the supplying line 403. The pure water and the carbon dioxide gas pass through the carbon dioxide dissolving film 405 to become carbonated water.

The carbonated water is supplied to the nozzle 407 by the supplying line 406, and ejected onto the semiconductor substrate W from the nozzle 407. The supplied amount of the carbonated water to the semiconductor substrate W can be adjusted by the open degree of the valve 409.

The surface treatment apparatus according to the third embodiment employs acid water in the rinsing process before the drying process, thereby being capable of preventing the elution of silicon and formation of the watermark. Accordingly, the collapse of the pattern and the formation of the watermark can be prevented, and the substrate can be cleaned and dried, like the first embodiment, by using the surface treatment apparatus according to the present embodiment.

In the above-mentioned embodiment, the rinsing process is performed with the use of carbonated water. However, as the acid water, solution obtained by dissolving nitrogen oxide $NO_x$ in pure water or solution obtained by mixing hydrochloric acid with pure water may be used.

The surface treatment apparatuses according to the first to third embodiments are suitable for cleaning and drying a semiconductor substrate having a convex pattern formed by a side-wall transfer process. In the side-wall transfer process, a second film 502 is firstly formed on a first film 501 formed on a semiconductor substrate (not shown) as shown in FIG. 10A. Then, a resist 503 having a line and space pattern is formed on the second film 502.

Next, as shown in FIG. 10B, the second film 502 is etched with the resist 503 being used as a mask so as to transfer the pattern.

As shown in FIG. 10C, a slimming process is performed to the second film 502 to decrease the width to about a half, and the resultant is processed into a core material 504. The resist 503 is removed before or after the slimming process. The slimming process is performed by a wetting process, a drying process, or the combination of a wetting process and a drying process.

Then, as shown in FIG. 10D, a third film 505 is formed, by a CVD (Chemical Vapor Deposition) method and the like, to cover the upper surface and the side surface of the core material 504 with a fixed thickness. The third film 505 is formed of a material that can assume a great etching selection ratio to the core material 504.

Then, as shown in FIG. 11A, the third film 505 is dry-etched until the top surface of the core material 504 is exposed. The dry-etching is performed under an etching condition having selectivity to the core material 504. Accordingly, the third film 505 remains in a spacer shape along the side surface of the core material 504. The remaining third film 505 is formed such that the upper end 505a is brought into contact with the upper portion of the side surface of the core material 504, and the upper side portion is curved convexly toward the outer side of the core material 504.

As shown in FIG. 11B, the core material 504 is removed by a wet-etching process. The third film 505 has an asymmetric pattern in which patterns having the narrower distance (the size of the opening width of the space pattern) between two adjacent patterns and patterns having the greater distance are present alternately.

When the asymmetric pattern like the third film 505 is cleaned and dried, the lowering speed of the liquid level of the rinsing liquid at the space portion is greatly different, so that great force is applied to the pattern, as shown in FIG. 11C, with the result that the prevention of the collapse of the pattern is difficult.

The first film 501 and the semiconductor substrate below the first film 501, which are subjects to be processed, are dry-etched with the obtained pattern of the third film 505 being used as a mask to transfer the pattern, and then, residual product by the reaction caused by the dry-etching is cleaned and removed. In this case, the size of the opening width of the space pattern varies even in the subject to be processed on which the pattern is transferred, because of the affect by the asymmetric shape of the third film 505, which has a shape that the upper side portion is curved convexly, used as the mask. Therefore, when the pattern on the subject to be processed is cleaned and dried, the lowering speed of the liquid level of the rinsing liquid at the space portion is greatly different, so that great force is applied to the pattern, as in the case of the pattern of the third film 505, with the result that the prevention of the collapse of the pattern is difficult.

However, since the water repellent process of the surface of the pattern and the diluted IPA rinsing process or the acid water rinsing process before the drying process are performed by using the surface treatment apparatuses according to the first to third embodiments, the substrate can be cleaned and dried, while preventing the collapse of the pattern and the formation of the watermark, even if the pattern is the asymmetric pattern formed by the side-wall transfer process.

As understood from the equation 1 and FIG. 4, the force P applied to the pattern 4 depends upon the vertical component of the surface tension $\gamma$. Therefore, as shown in FIG. 12A, the vertical component of the surface tension $\gamma$ can be decreased to reduce the force applied to the pattern, by the configuration in which the upper portion of the pattern is tilted.

The configuration described above can be formed by lowering the temperature or setting the condition in which the selection ratio between the mask material and the pattern material is low, when the pattern is processed with RIE.

As shown in FIG. 12B, the same effect can be obtained in the configuration in which the whole pattern is tilted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of treating a surface of a semiconductor substrate, comprising:
    forming a convex pattern on the semiconductor substrate by a process including a dry etching, the surface of the convex pattern containing a silicon;
    supplying a silane coupling agent onto the convex pattern to form a protective film on the surface of the convex pattern;
    supplying a rinsing agent containing alcohol onto the surface of the semiconductor substrate where the silane coupling agent is remaining to rinse the semiconductor substrate; and
    drying the rinsed semiconductor substrate by removing the rinsing agent from the semiconductor substrate.

2. The method according to claim 1, wherein the surface of the convex pattern is oxidized before supplying the silane coupling agent onto the convex pattern, and the protective film is formed on the oxidized surface of the convex pattern.

3. The method according to claim 1, wherein the semiconductor substrate is rinsed by using alcohol before supplying the silane coupling agent onto the convex pattern.

4. The method according to claim 1, wherein the convex pattern has an aspect ratio of eight or more.

5. The method according to claim 1, wherein the convex pattern comprises a silicon nitride or a polysilicon.

6. The method according to claim 1, further comprising:
    removing the protective film with the convex pattern after drying the semiconductor substrate.

7. The method according to claim 1, wherein the convex pattern is formed by depositing a film to cover side surfaces of a core material and removing the core materials to remain the film as the convex pattern.

8. The method according to claim 1, wherein the alcohol contains IPA.

9. The method according to claim 1, wherein during the rinsing process using the rinsing agent containing alcohol after forming the protective film and before drying the semiconductor substrate, pure water containing no alcohol is not used for rinsing the semiconductor substrate.

10. The method according to claim 1, wherein the silane coupling agent includes HMDS.

11. The method according to claim 1, wherein the silane coupling agent includes TMSDEA.

12. The method according to claim 1, wherein the protective film is a water repellent protective film.

13. The method according to claim 1, further comprising:
cleaning the semiconductor substrate having the convex pattern by supplying SPM, SC-1, SC-2, or HF onto the substrate before supplying the silane coupling agent onto the semiconductor substrate.

14. The method according to claim 1, wherein the convex pattern has a pattern size of 30 nm or less.

15. The method according to claim 1, wherein the convex pattern is a line and space pattern.

16. The method according to claim 1, wherein the silane coupling agent is diluted with cyclohexanone or alcohol and the diluted silane coupling agent is supplied onto the convex pattern to form a protective film on the surface of the convex pattern.

17. The method according to claim 1, wherein the rinsing agent is blown away from the surface of the semiconductor substrate by a spin-drying process during drying the rinsed semiconductor substrate.

18. The method according to claim 1, wherein the rinsing agent is evaporated from the surface of the semiconductor substrate by subjecting the semiconductor substrate where the rinsing agent is remaining to air during drying the rinsed semiconductor substrate.

* * * * *